US012774515B2

(12) United States Patent
Cho et al.

(10) Patent No.: US 12,774,515 B2
(45) Date of Patent: Oct. 27, 2026

(54) WINDOW, DISPLAY DEVICE INCLUDING THE SAME, AND METHOD OF MANUFACTURING THE WINDOW

(71) Applicant: Samsung Display Co., Ltd., Yongin-Si (KR)

(72) Inventors: Jonghwan Cho, Yongin-si (KR); Myung-Seok Kwon, Yongin-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 196 days.

(21) Appl. No.: 18/410,110

(22) Filed: Jan. 11, 2024

(65) Prior Publication Data

US 2024/0368749 A1 Nov. 7, 2024

(30) Foreign Application Priority Data

May 2, 2023 (KR) ........................ 10-2023-0056963

(51) Int. Cl.

*C23C 14/12* (2006.01)
*C23C 14/24* (2006.01)
*C23C 14/58* (2006.01)
*H05K 5/03* (2006.01)

(52) U.S. Cl.

CPC .............. *C23C 14/12* (2013.01); *C23C 14/24* (2013.01); *C23C 14/5826* (2013.01); *H05K 5/03* (2013.01)

(58) Field of Classification Search

None

See application file for complete search history.

(56) References Cited

U.S. PATENT DOCUMENTS

| | | | | |
|---|---|---|---|---|
| 10,067,269 | B2 | 9/2018 | Lee et al. | |
| 10,730,253 | B2 | 8/2020 | Yamamura et al. | |
| 11,098,218 | B2 | 8/2021 | Matsuyuki et al. | |
| 11,912,887 | B2 * | 2/2024 | Lee | C09D 5/1681 |
| 2007/0053063 | A1 * | 3/2007 | Adachi | G02F 1/133502 359/582 |
| 2014/0272290 | A1 * | 9/2014 | Jewhurst | C09D 127/18 428/521 |
| 2018/0118957 | A1 * | 5/2018 | Brown | C09D 5/1693 |
| 2019/0033494 | A1 | 1/2019 | Kim et al. | |
| 2021/0380474 | A1 * | 12/2021 | Brandenburg | C03C 17/32 |
| 2022/0227953 | A1 | 7/2022 | Lee et al. | |

FOREIGN PATENT DOCUMENTS

| | | |
|---|---|---|
| JP | 2001-261867 | 9/2001 |
| JP | 2008-266728 | 11/2008 |
| JP | 2019-189914 | 10/2019 |
| JP | 6715461 | 7/2021 |
| KR | 10-2015-0016148 | 2/2015 |
| KR | 10-2018-0031897 | 3/2018 |
| KR | 10-2019-0012847 | 2/2019 |
| KR | 10-2273269 | 7/2021 |
| KR | 10-2021-0151878 | 12/2021 |
| KR | 10-2022-0105255 | 7/2022 |

* cited by examiner

*Primary Examiner* — Ramsey Zacharia

(74) *Attorney, Agent, or Firm* — F. CHAU & ASSOCIATES, LLC

(57) ABSTRACT

A window includes: a base layer; and a protection layer disposed on the base layer and including a fluorine-based crosslinked polymer, wherein the fluorine-based crosslinked polymer includes a first polymer chain, a second polymer chain, and a crosslinking portion that bonds carbon atoms of the first polymer chain to carbon atoms of the second polymer chain.

11 Claims, 10 Drawing Sheets

WINDOW, DISPLAY DEVICE INCLUDING THE SAME, AND METHOD OF MANUFACTURING THE WINDOW

CROSS-REFERENCE TO RELATED APPLICATION

This U.S. non-provisional patent application claims priority under 35 U.S.C. § 119 of Korean Patent Application No. 10-2023-0056963, filed on May 2, 2023, the disclosure of which is incorporated by reference herein in its entirety.

TECHNICAL FIELD

The present inventive concept herein relates to a window, a display device including the same, and a method of manufacturing the window, and more particularly, to a window including a protection layer and having low reflection properties, a display device including the same, and a method of manufacturing the window.

DISCUSSION OF THE RELATED ART

Various types of electronic devices are used to provide image information. Lately, electronic devices including flexible display devices that are foldable or bendable have been under development. The flexible display devices, unlike rigid display devices, are variously modifiable in shape by being foldable, rollable, or bendable, and thus, flexible display devices have increased portability without being limited to display screen sizes.

Such flexible display devices should have a window that serves to protect a display panel without hindering the operation of folding or bending. Accordingly, a window, which has folding properties as well as optical properties and mechanical properties, has been under development.

SUMMARY

According to an embodiment of the present inventive concept, a window includes: a base layer; and a protection layer disposed on the base layer and including a fluorine-based crosslinked polymer, wherein the fluorine-based crosslinked polymer includes a first polymer chain, a second polymer chain, and a crosslinking portion that bonds carbon atoms of the first polymer chain to carbon atoms of the second polymer chain.

In an embodiment of the present inventive concept, the fluorine-based crosslinked polymer includes at least one of polytetrafluoroethylene (PTFE), perfluoroalkoxy alkane (PFA), or fluorinated ethylene propylene (FEP).

In an embodiment of the present inventive concept, the protection layer has a thickness of about 70 nm to about 130 nm.

In an embodiment of the present inventive concept, the protection layer has a refractive index of about 1.35 or less at a wavelength of about 550 nm.

In an embodiment of the present inventive concept, the protection layer has a reflectance of about 2.0% or less on an upper surface thereof at a wavelength of about 550 nm.

In an embodiment of the present inventive concept, an upper surface of the protection layer has an initial water contact angle of about 100° or greater.

In an embodiment of the present inventive concept, some carbon atoms included in the first polymer chain of the fluorine-based crosslinked polymer that is adjacent to the base layer are covalently bonded to the base layer.

In an embodiment of the present inventive concept, the window further includes a hard coating layer disposed between the base layer and the protection layer, wherein some carbon atoms included in the first polymer chain of the fluorine-based crosslinked polymer that is adjacent to the hard coating layer are covalently bonded to the hard coating layer.

In an embodiment of the present inventive concept, the fluorine-based crosslinked polymer includes perfluoropolyether (PFPE) and polytetrafluoroethylene (PTFE).

In an embodiment of the present inventive concept, the fluorine-based crosslinked polymer includes a perfluoropolyether-polytetrafluoroethylene block copolymer (PFPE-PTFE block copolymer), and PFPE and PTFE included in the PFPE-PTFE block copolymer are in a weight ratio of about 1:9 to about 3:7.

In an embodiment of the present inventive concept, the protection layer has a thickness of about 2 nm to about 40 nm.

In an embodiment of the present inventive concept, the protection layer has a refractive index of about 1.35 or less at a wavelength of about 550 nm.

In an embodiment of the present inventive concept, the window further includes a low refractive layer disposed between the base layer and the protection layer, and an adhesive layer disposed between the low refractive layer and the protection layer, wherein some carbon atoms included in the first polymer chain of the fluorine-based crosslinked polymer that is adjacent to the adhesive layer are covalently bonded to the adhesive layer.

According to an embodiment of the present inventive concept, a method of manufacturing a window includes: preparing a base layer; and depositing a fluorine-based polymer on the base layer in a vacuum condition to form a protection layer, wherein the forming of the protection layer includes irradiating the fluorine-based polymer with an electron beam to remove some fluorine atoms that are bonded to a polymer chain, and subjecting carbon atoms, which are at the position from which the fluorine atoms are removed, to crosslinking between polymer chains with adjacent polymer chains through carbon-carbon bonds to form a fluorine-based crosslinked polymer.

In an embodiment of the present inventive concept, the forming of the protection layer includes covalently bonding some carbon atoms, which are at the position from which the fluorine atoms are removed, to the base layer.

In an embodiment of the present inventive concept, energy of the electron beam is about 200 KeV to about 400 KeV.

In an embodiment of the present inventive concept, the fluorine-based crosslinked polymer includes at least one of polytetrafluoroethylene (PTFE), perfluoroalkoxy alkane (PFA), or fluorinated ethylene propylene (FEP).

In an embodiment of the present inventive concept, the fluorine-based crosslinked polymer includes a perfluoropolyether-polytetrafluoroethylene block copolymer (PFPE-PTFE block copolymer), and PFPE and PTFE included in the PFPE-PTFE block copolymer are in a weight ratio of about 1:9 to about 3:7.

According to an embodiment of the present inventive concept, a display device includes: a display module including a first non-folding region, a folding region, and a second non-folding region, which are arranged along a first direction; and a window disposed on the display module, wherein the window includes: a base layer; and a protection layer disposed on the base layer and including a fluorine-based crosslinked polymer, wherein the fluorine-based crosslinked polymer includes a first polymer chain, a second polymer chain, and a crosslinking portion that bonds carbon atoms of the first polymer chain to carbon atoms of the second polymer chain.

In an embodiment of the present inventive concept, the fluorine-based crosslinked polymer includes at least one of polytetrafluoroethylene (PTFE), perfluoroalkoxy alkane (PFA), or fluorinated ethylene propylene (FEP).

BRIEF DESCRIPTION OF THE DRAWINGS

The above and other features of the present inventive concept will become apparent by describing in detail embodiments thereof with reference to the accompanying drawings, in which.

DETAILED DESCRIPTION OF THE EMBODIMENTS

Figure 1A:
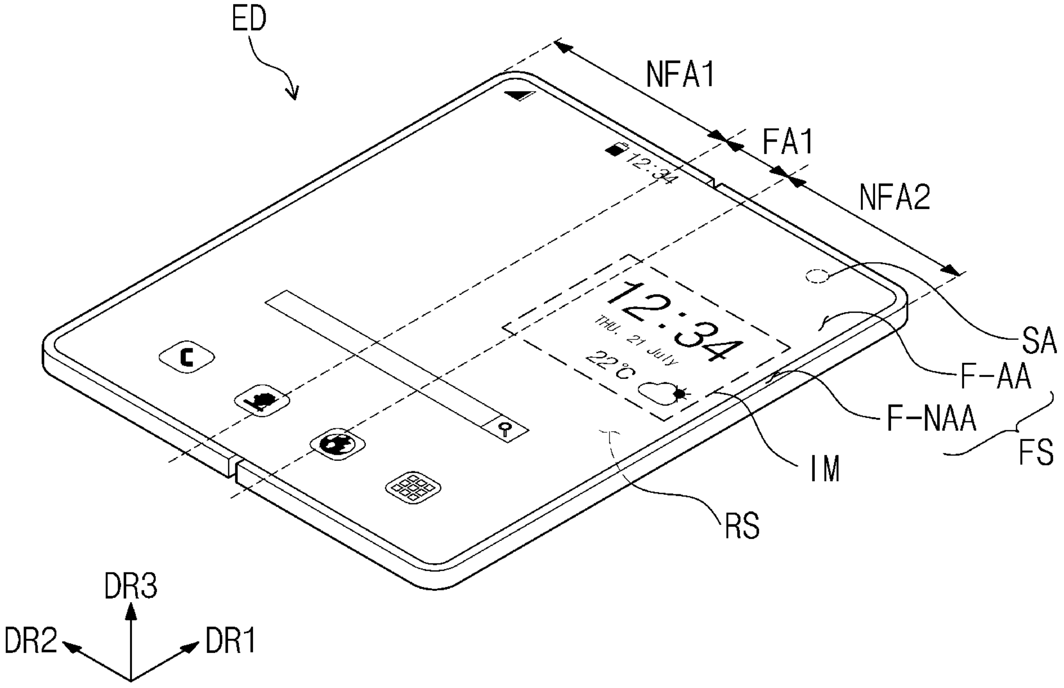
FIG. 1A is a perspective view showing a state in which a display device according to an embodiment of the present inventive concept is unfolded.

Since the present inventive concept may have various modifications and be embodied in different forms, specific embodiments are illustrated in the drawings and described in detail in the description. However, the disclosed embodiments are not intended to limit the present inventive concept to the specific embodiments, and it should be understood that the present disclosure covers all the modifications, equivalents, and replacements within the idea and technical scope of the present inventive concept.

As used herein, the terms of a singular form may include a plural form unless the context clearly indicates otherwise.

As used herein, when an element (or a region, a layer, a portion, and the like) is referred to as being "on", "connected to", or "coupled to" another element, it indicates that the element may be directly disposed on/connected to/coupled to the other element, or that a third element may be disposed therebetween.

Also, terms such as "below," "lower," "above," and "upper" may be used to describe the relationships of the components illustrated in the drawings. These terms are used as a spatially relative concept and are described based on the directions indicated in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, being "disposed on" may represent not only being disposed on the top surface but also being disposed on the bottom surface.

As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

As used herein, the term "and/or" includes all combinations of one or more of which associated configurations may define.

As used herein, although the terms first, second, and the like may be used herein to describe various elements, these elements should not be limited by these terms. These terms are only used to distinguish one element from other elements. For example, a first element may be referred to as a second element, and similarly, a second element may be referred to as a first element without departing from the scope of the present disclosure.

Like numbers refer to like elements throughout the specification. In addition, various thicknesses, lengths, and angles are shown and while the arrangement shown does indeed represent an embodiment of the present disclosure, it is to be understood that modifications of the various thicknesses, lengths, and angles may be possible within the spirit and scope of the present disclosure and the present disclosure is not necessarily limited to the particular thicknesses, lengths, and angles shown.

Hereinafter, a window according to an embodiment of the present inventive concept and a method of manufacturing the same will be described with reference to the drawings.

Figure 1B:
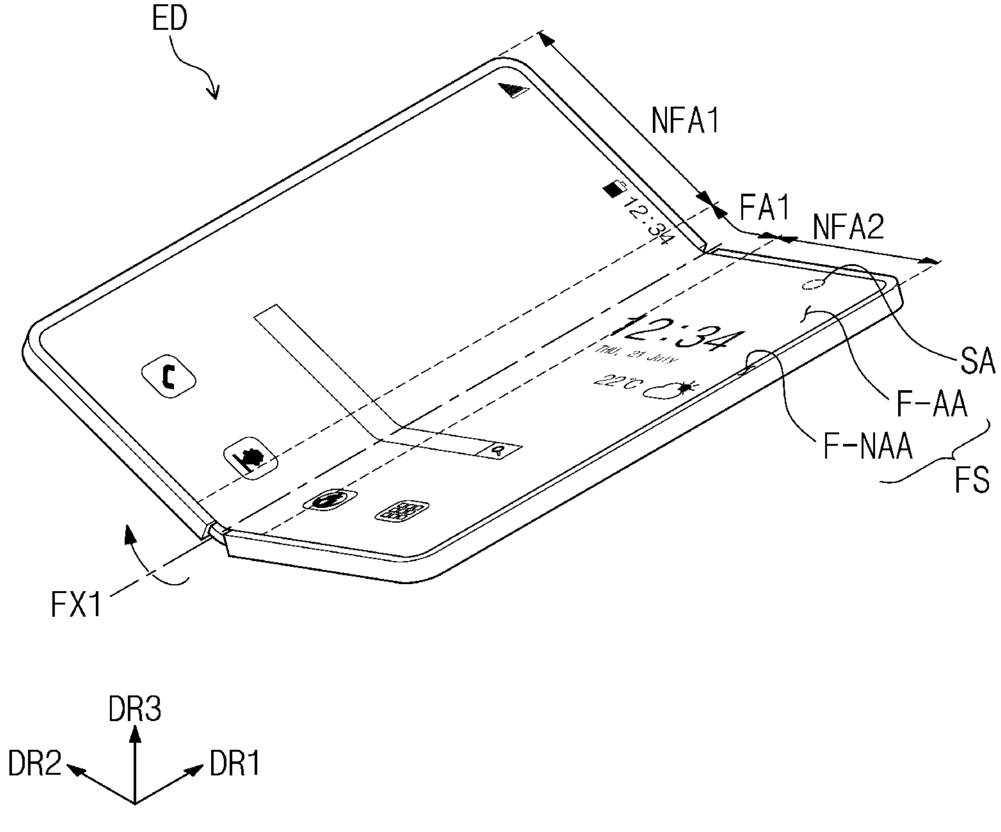
FIG. 1B is a perspective view showing an in-folding process of a display device according to an embodiment of the present inventive concept.
Figure 1C:
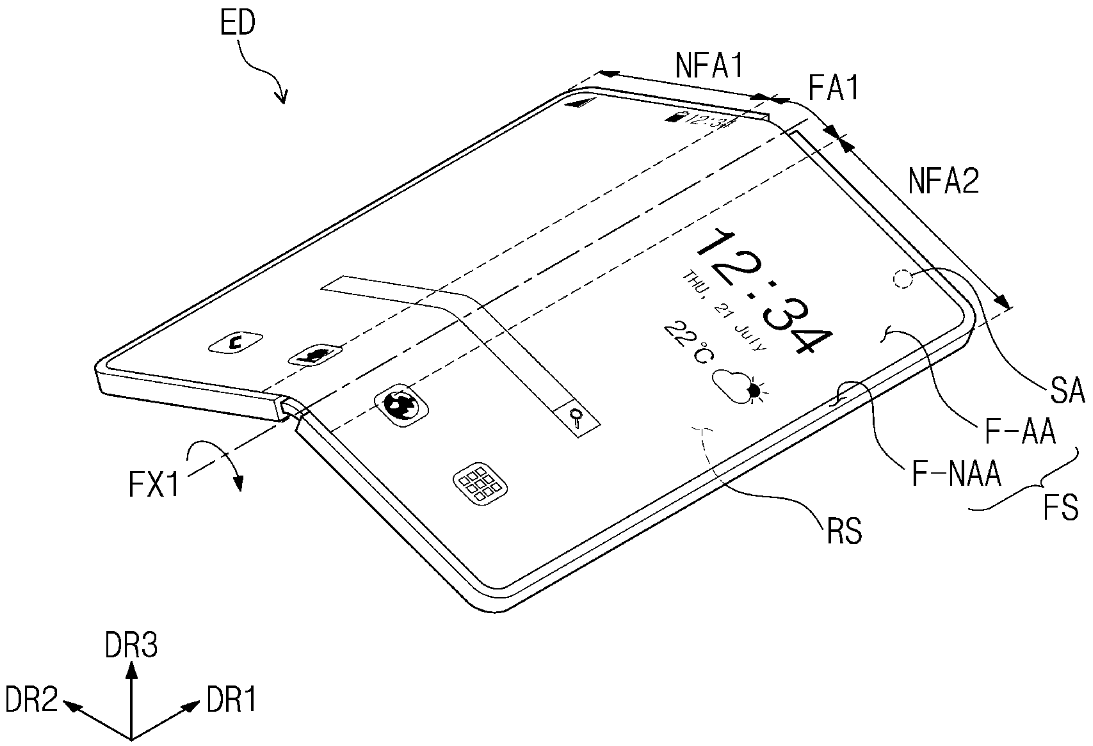
FIG. 1C is a perspective view showing an out-folding process of a display device according to an embodiment of the present inventive concept.

FIG. 1A is a perspective view showing a state in which a display device ED according to an embodiment of the present inventive concept is unfolded. FIG. 1B is a perspective view showing an in-folding process of the display device ED shown in FIG. 1A. FIG. 1C is a perspective view showing an out-folding process of the display device ED shown in FIG. 1A.

The display device ED may be a device activated according to electrical signals. For example, the display device ED may be a mobile phone, a tablet, a car navigation system, a game console, or a wearable device, but the embodiment of the present inventive concept is not limited thereto. In FIGS. 1A to 1C, and the like, as an example, a mobile phone is shown as the display device ED.

In FIGS. 1A to 1C, the display device ED is shown as a foldable display device capable of being folded into a smaller size, but the embodiment of the present inventive concept is not limited thereto, and the display device ED according to an embodiment of the present inventive concept may be a flexible display device that is bendable or rollable to be deformed.

In addition, FIG. 1A and the following drawings show a first direction DR1, a second direction DR2, and a third direction DR3, and directions indicated by the first to third directions DR1, DR2, and DR3 described herein are relative concepts, and may thus be changed to other directions.

Referring to FIGS. 1A to 1C, the display device ED according to an embodiment of the present inventive concept may include a display surface FS defined by the first direction DR1 and the second direction DR2 crossing the first direction DR1. The display device ED may provide an image IM to users through the display surface FS. The display device ED according to an embodiment of the present inventive concept may display the image IM, towards the third direction DR3, on the display surface FS that is parallel to each of the first direction DR1 and the second direction DR2. In the present description, a front surface (or an upper surface) and a rear surface (or a lower surface) of respective members are defined with respect to a direction in which the image IM is displayed.

The display device ED according to an embodiment of the present inventive concept may detect external inputs that are applied from the outside. The external inputs may include various forms of inputs provided from outside of the display device ED. For example, the external inputs may include external inputs (e.g., touches from objects or body parts) applied when approaching the display device ED or being adjacent by a predetermined distance (e.g., hovering) to the display device ED, as well as contact by body parts such as a user's hand on the display device ED. In addition, the external inputs may have various forms such as force, pressure, temperature, light, and the like.

The display device ED may include an active region F-AA and a peripheral region F-NAA. The active region F-AA may be a region that is activated according to electrical signals. The display device ED according to an embodiment of the present inventive concept may display the image IM through the active region F-AA. In addition, the active region F-AA may detect various forms of external inputs. The peripheral region F-NAA is adjacent to the active region F-AA. The peripheral region F-NAA may have a predetermined color. For example, the peripheral region F-NAA may cover the active region F-AA. Accordingly, the shape of the active region F-AA may be substantially defined by the peripheral region F-NAA. However, this is shown as an example, and the peripheral region F-NAA may be disposed adjacent to only one side of the active region F-AA, or may be omitted. The display device ED according to an embodiment of the present inventive concept may include various forms of active regions and is not limited to any one embodiment of the present inventive concept.

The active region F-AA may include a sensing region SA. The sensing region SA may have various electronic modules disposed therein. For example, the electronic modules may include at least one of a camera module, a speaker, a light detection sensor, and/or a heat detection sensor. The sensing region SA may detect an external subject received through the display surface FS, or provide sound signals such as voice to the outside through the display surface FS. The electronic modules may include a plurality of components and are not limited to any one embodiment of the present inventive concept.

The sensing region SA may be surrounded by the active region F-AA and the peripheral region F-NAA. However, the embodiment of the present inventive concept is not limited thereto, and the sensing region SA may be disposed in the active region F-AA, but the present inventive concept is not limited thereto. In FIG. 1A and the like, one sensing region SA is shown as an example, but the number of sensing regions SA is not limited thereto.

The sensing region SA may be a portion of the active region F-AA. Accordingly, the display device ED may display images through the sensing region SA. When the electronic modules that are disposed in the sensing region SA are deactivated, the sensing region SA, as a display surface, may display videos or images.

A rear surface RS of the display device ED according to an embodiment of the present inventive concept may be a surface facing the display surface FS. In an embodiment of the present inventive concept, the rear surface RS is an outer surface of the display device ED, and might not display videos or images. However, the embodiment of the present inventive concept is not limited thereto, and the rear surface RS may serve as a second display surface on which videos or images may be displayed. In addition, the display device ED according to an embodiment of the present inventive concept may further include a sensing region that is disposed on the rear surface RS. A camera, a speaker, a light detection sensor, and the like may also be disposed in the sensing region disposed on the rear surface RS.

The display device ED may include a folding region FA1 and non-folding regions NFA1 and NFA2. The display device ED may include a plurality of non-folding regions NFA1 and NFA2. The display device ED according to an embodiment of the present inventive concept may include a first non-folding region NFA1 and a second non-folding region NFA2 disposed with the folding region FA1 therebetween. In addition, FIGS. 1A to 1C shows the display device ED, according to an embodiment of the present inventive concept, including one folding region FA1, but the present inventive concept is not limited thereto, and in the display device ED, a plurality of folding regions may be provided. The display device ED according to an embodiment of the present inventive concept may be folded with respect to a plurality of folding axes such that portions of the display surface FS may face each other, and the number of folding axes and the number of the corresponding non-folding regions are not particularly limited.

Referring to FIGS. 1B and 1C, the display device ED according to an embodiment may be folded with respect to a first folding axis FX1. The first folding axis FX1 shown in FIGS. 1B and 1C is a virtual axis extending in a direction of the first direction DR1, and the first folding axis FX1 may be parallel to a long side direction of the display device ED. However, the present inventive concept is not limited thereto, and a direction that the first folding axis FX1 extends is not limited to the first direction DR1.

The first folding axis FX1 may extend on the display surface FS along the first direction DR1 or may extend below the rear surface RS along the first direction DR1. Referring to FIG. 1B, in an embodiment of the present inventive concept, the first non-folding region NFA1 and the second non-folding region NFA2 face each other, and the display device ED may be inner-folded such that the display surface FS is not exposed to the outside. In addition, referring to FIG. 1C, the display device ED may be folded with respect to the first folding axis FX1 to become outer-folded such that one region overlapping the first non-folding region NFA1 and the other region overlapping the second non-folding region NFA2 of the rear surface RS face each other.

Figure 2A:
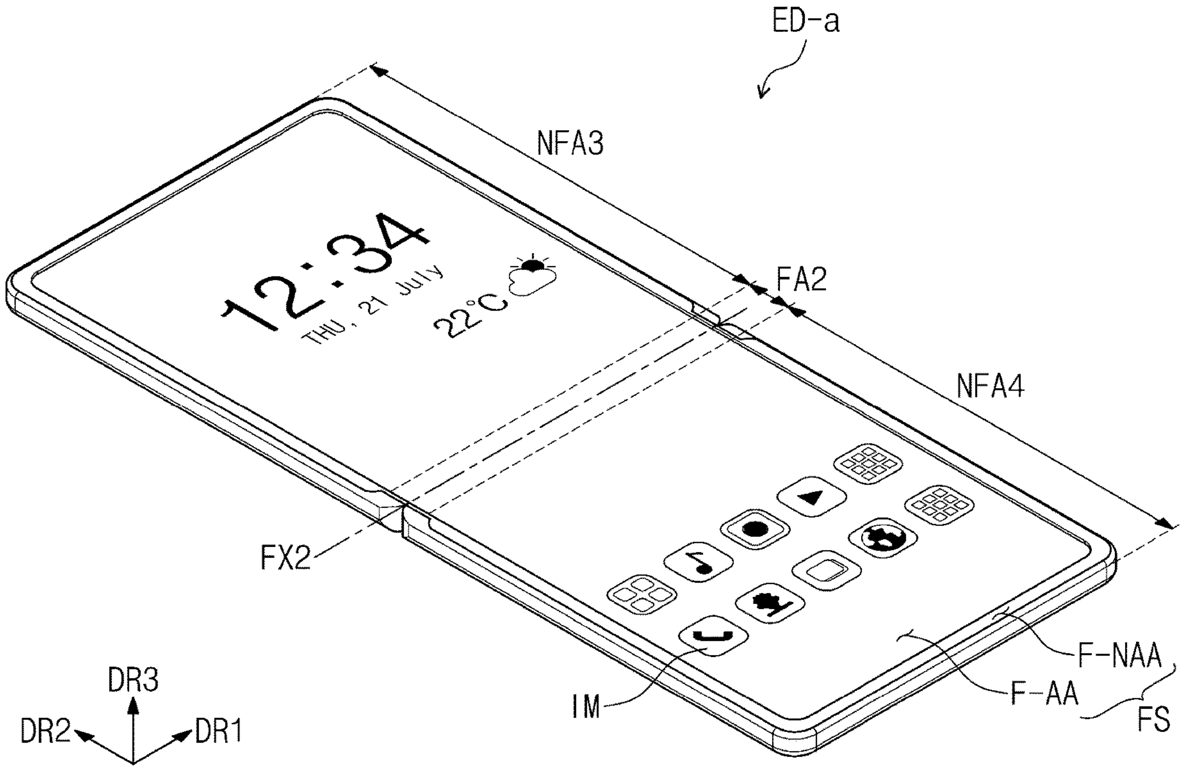
FIG. 2A is a perspective view showing a state in which a display device according to an embodiment of the present inventive concept is unfolded.
Figure 2B:
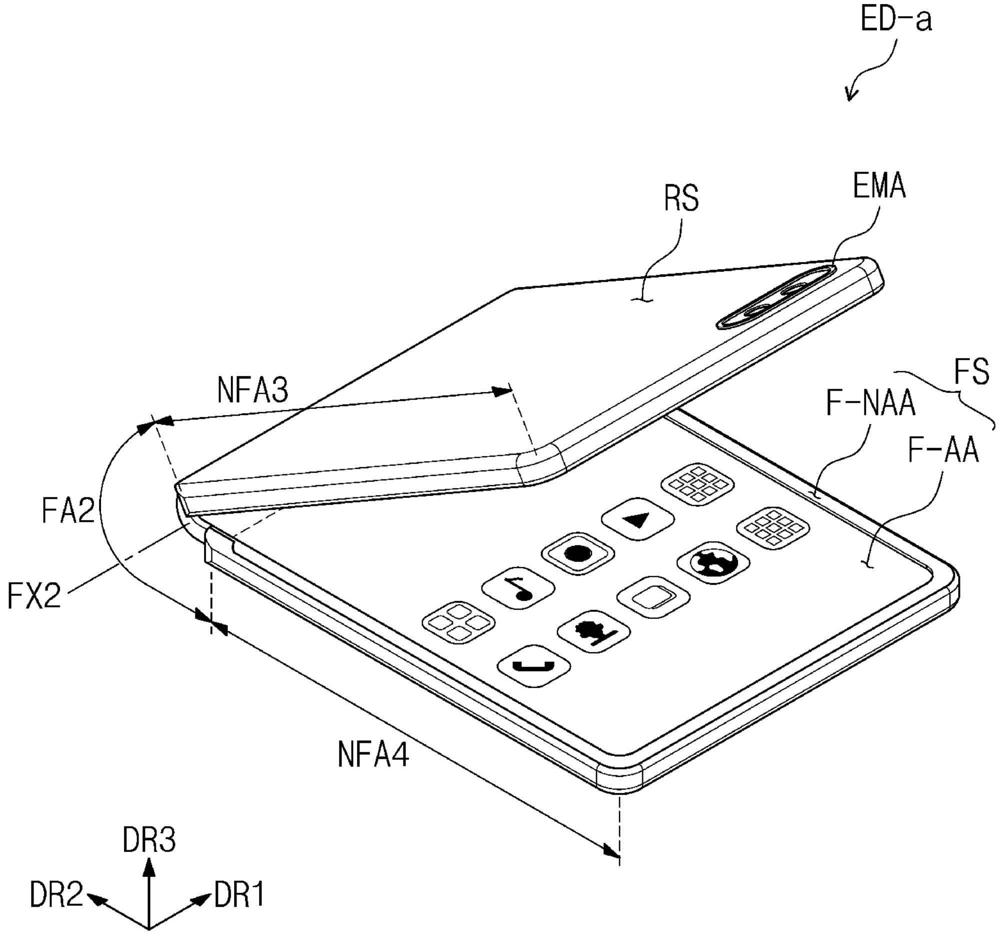
FIG. 2B is a perspective view showing an in-folding process of the display device according to an embodiment of the present inventive concept shown in FIG. 2A.

FIG. 2A is a perspective view showing a state in which a display device ED-a according to an embodiment of the present inventive concept is unfolded. FIG. 2B is a perspective view showing an in-folding process of the display device ED-a shown in FIG. 2A.

A display device ED-a according to an embodiment of the present inventive concept may be folded with respect to a second folding axis FX2 extending in one direction parallel to the first direction axis DR1. FIG. 2B shows a case in which a direction that the second folding axis FX2 extends is parallel to a direction that a short side of the display device ED-a extends. However, the embodiment of the present inventive concept is not limited thereto.

The display device ED-a according to an embodiment of the present inventive concept may include at least one folding region FA2 and non-folding regions NFA3 and NFA4 that are adjacent to the folding region FA2. The non-folding regions NFA3 and NFA4 may be spaced apart from each other with the folding region FA2 disposed therebetween.

The folding region FA2 has a predetermined curvature and a predetermined radius of curvature. In an embodiment of the present inventive concept, the first non-folding region NFA3 and the second non-folding region NFA4 may face each other, and the display device ED-a may be in-folded such that the display surface FS is not exposed to the outside.

In addition, in an embodiment of the present inventive concept, the display device ED-a may be out-folded such that the display surface FS is exposed to the outside. In addition, in an embodiment of the present inventive concept, when the display device ED-a is in the unfolded state, the first display surface FS may be viewed by users, and when being in the inner-folded state, the second display surface RS may be viewed by users. The second display surface RS may include an electronic module region EMA in which electronic modules including various components are disposed.

The display device ED-a according to an embodiment of the present inventive concept may include a second display surface RS, and the second display surface RS may be a surface facing at least a portion of the first display surface FS. When the display device ED-a is in the inner-folded state, the second display surface RS may be viewed by users. The second display surface RS may include an electronic module region EMA in which electronic modules including various components are disposed. In addition, in an embodiment of the present inventive concept, images may be provided through the second display surface RS.

In an embodiment of the present inventive concept, the display devices ED and ED-a may be configured such that an inner-folding operation or an outer-folding operation is mutually repeated from an unfolding operation, but the embodiment of the present inventive concept is not limited thereto. In an embodiment of the present inventive concept, the display devices ED and ED-a may be configured with any one of an unfolding operation, an inner-folding operation, and/or an outer-folding operation.

In FIGS. 1A to 2B, the display devices ED and ED-a are shown as foldable display devices deformable into a folded shape, but the present inventive concept is not limited thereto, and the display devices ED and ED-a according to an embodiment of the present inventive concept may be flexible display devices that are bendable or rollable to be deformed.

Figure 3:
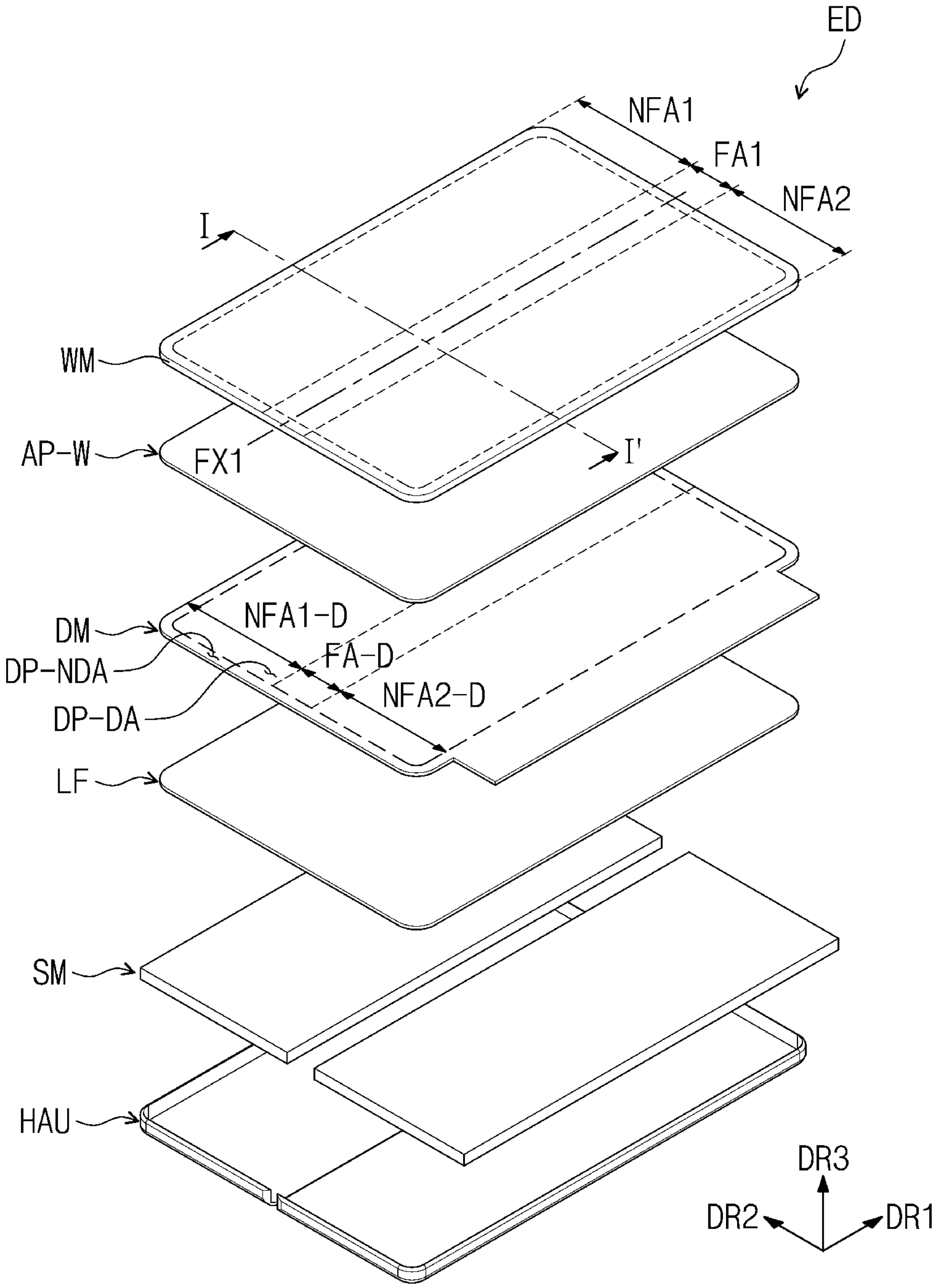
FIG. 3 is an exploded perspective view of a display device according to an embodiment of the present inventive concept.
Figure 4:
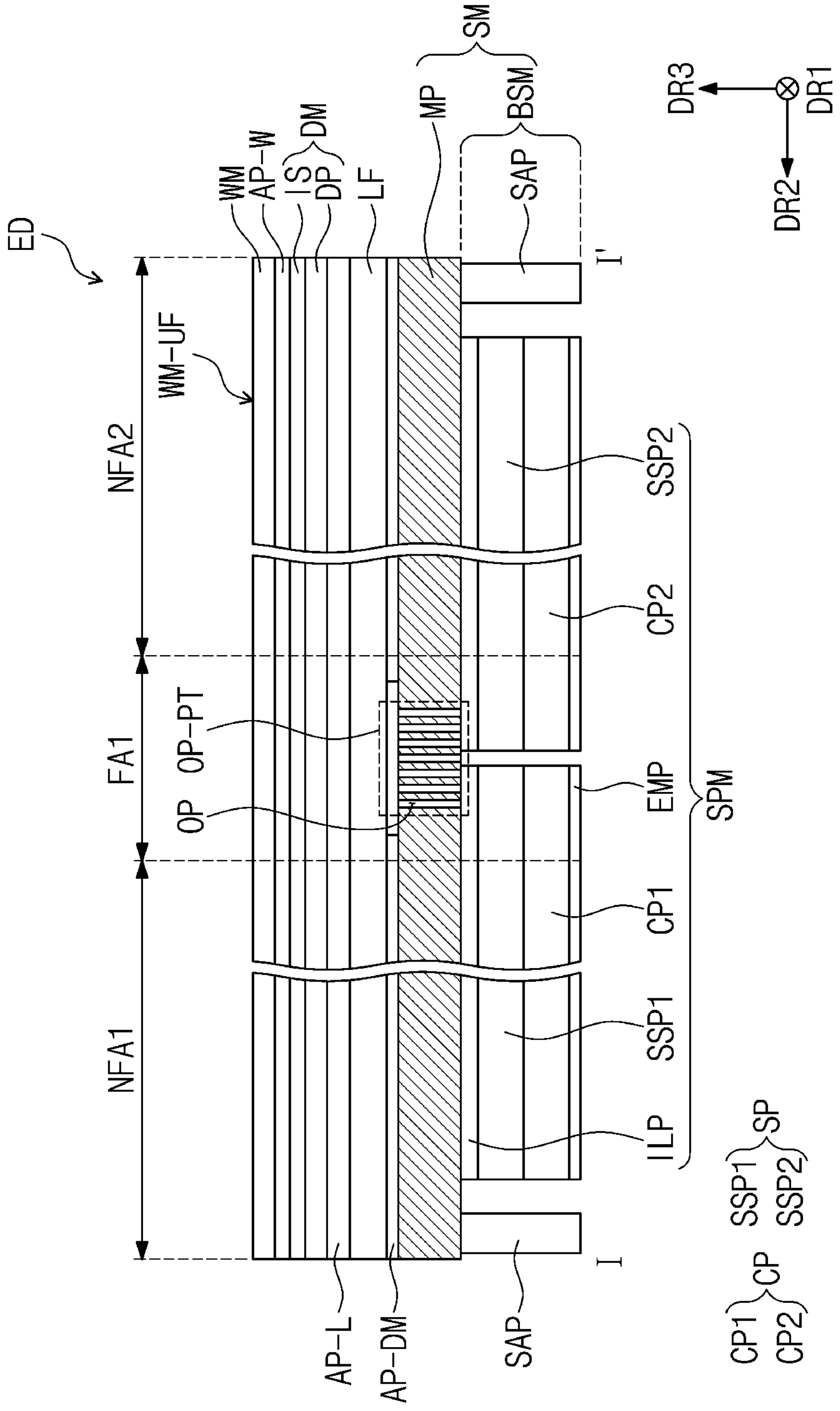
FIG. 4 is a cross-sectional view of a display device according to an embodiment of the present inventive concept.

FIG. 3 is an exploded perspective view of a display device ED according to an embodiment of the present inventive concept, and FIG. 4 is a cross-sectional view of a display device ED according to an embodiment of the present inventive concept. FIG. 3 shows an exploded perspective view of a display device ED according to an embodiment of the present inventive concept shown in FIG. 1A as an example. FIG. 4 is a cross-sectional view showing a portion corresponding to line I-I' of FIG. 3.

Referring to FIGS. 3 and 4, the display device ED of an embodiment of the present inventive concept may include a display module DM and a window WM disposed on the display module DM. In addition, the display device ED of an embodiment of the present inventive concept may further include a support module SM disposed below the display module DM. In FIGS. 3 and 4, the display device ED shown in FIGS. 1A to 1C is described as an embodiment of the present inventive concept, but the following descriptions may be equally applied to the display device ED-a shown in FIGS. 2A and 2B.

The window WM may cover the display module DM. For example, the window WM may cover an entire outer portion of the display module DM. The window WM may have a shape corresponding to the shape of the display module DM. In addition, the display device ED according to an embodiment of the present inventive concept may include a housing HAU accommodating the display module DM, the support module SM, and the like. For example, the display module DM, the support module SM, and the like may be disposed in the housing HAU. The housing HAU may be bonded to the window WM. The housing HAU may further include a hinge structure to make folding or bending easy.

In the display device ED according to an embodiment of the present inventive concept, the display module DM may display images according to electrical signals and transmit/receive information on external inputs. A display surface of the display module DM may be divided into a display region DP-DA and a non-display region DP-NDA. The display region DP-DA may be a region outputting images that are provided from the display module DM.

The non-display region DP-NDA is adjacent to the display region DP-DA. For example, the non-display region DP-NDA may surround the display region DP-DA. However, this is shown as an example, and the non-display region DP-NDA may include various shapes, and the present inventive concept is not limited thereto. According to an embodiment of the present inventive concept, the display region DP-DA of the display module DM may correspond to at least a portion of the first active region F-AA (FIG. 1A).

In the display device ED according to an embodiment of the present inventive concept, the display module DM may include a folding display portion FA-D and non-folding display portions NFA1-D and NFA2-D. The folding display portion FA-D may be a portion corresponding to the folding region FA1 of the display device ED, and the non-folding display portions NFA1-D and NFA2-D may be portions corresponding to the non-folding regions NFA1 and NFA2 of the display device ED.

The window WM according to an embodiment of the present inventive concept is disposed on the display module DM. The window WM may include, for example, an optically transparent insulating material. The window WM may protect the display panel DP and a sensor layer IS. For example, the window WM may be a cover window covering an upper portion of the display module DM.

The image IM (FIG. 1A) generated from the display panel DP may be provided to users by being transmitted through the window WM. The window WM may provide a touch surface of the display device ED. In the display device ED including the folding region FA1, the window WM may be a flexible window such that is foldable.

The window WM may be provided as a display surface and a touch surface, and may exhibit excellent optical properties. The window WM according to an embodiment of the present inventive concept may have a high transmittance of about 90% or greater in a visible light range of about 380 nm to about 780 nm.

Figure 5:
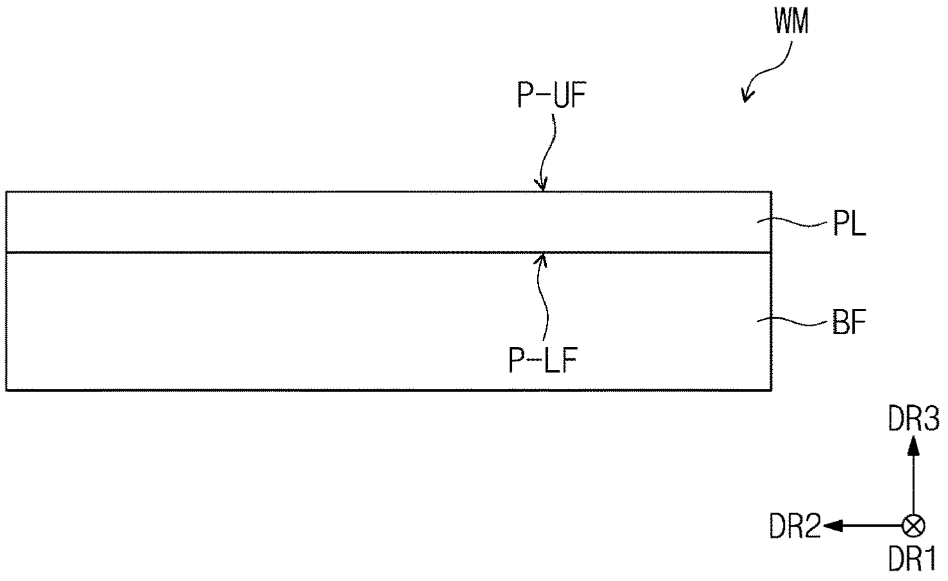
FIG. 5 is a cross-sectional view of a window according to an embodiment of the present inventive concept.
Figure 6:
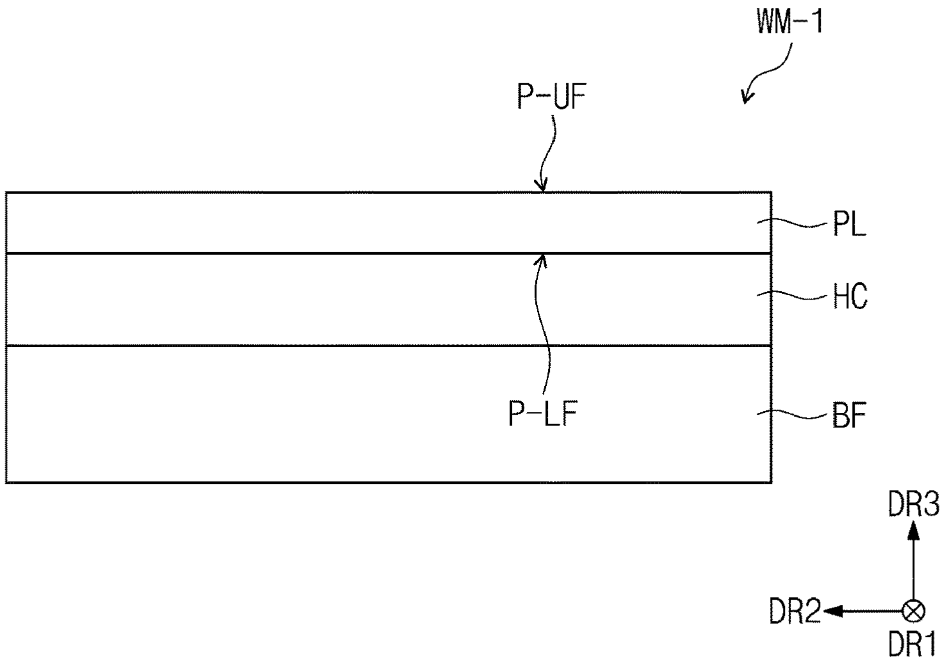
FIG. 6 is a cross-sectional view of a window according to an embodiment of the present inventive concept.
Figure 7:
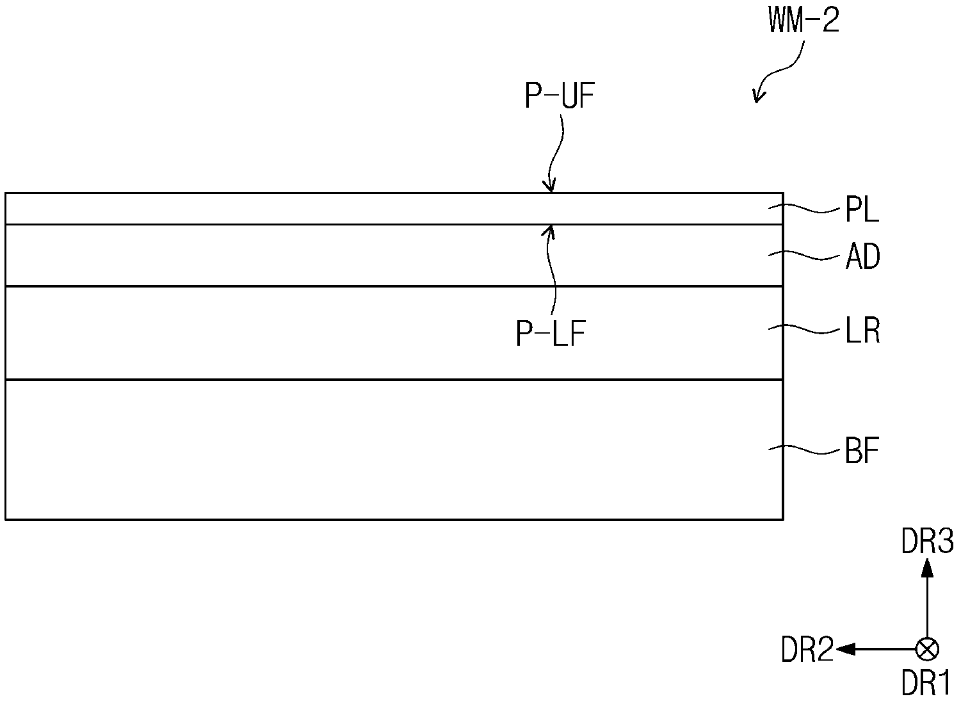
FIG. 7 is a cross-sectional view of a window according to an embodiment of the present inventive concept.

The window WM of an embodiment of the present inventive concept includes a base layer BF (FIGS. 5 to 7) and a protection layer PL (FIGS. 5 to 7) disposed on the base layer BF (FIGS. 5 to 7). Accordingly, the display device ED including the window WM according to an embodiment of the present inventive concept may have increased viewability and folding properties. The window WM according to an embodiment of the present inventive concept will be described in detail later.

The display module DM may include a display panel DP and a sensor layer IS disposed on the display panel DP. In addition, the display module DM may further include an optical layer disposed on the sensor layer IS. The optical layer may serve to reduce reflection by external light. For example, the optical layer may include a polarizing layer or a color filter layer.

The display panel DP may be configured to generate images. For example, the display panel DP may be an organic light emitting display panel, an inorganic light emitting display panel, a quantum dot display panel, a micro LED display panel, a nano LED display panel, or a liquid crystal display panel. The display panel DP may be referred to as a display layer.

The sensor layer IS may be disposed on the display panel DP. The sensor layer IS may detect external inputs that are applied from the outside. The external inputs may be user inputs. For example, the user inputs may include various types of external inputs such as a body part of users, light, heat, pen, or pressure.

In the display module DM according to an embodiment of the present inventive concept, the sensor layer IS may be formed on the display panel DP through a roll-to-roll process. For example, in this case, the sensor layer IS may be expressed as being directly disposed on the display panel DP. Being directly disposed may indicate that a third component is not disposed between the sensor layer IS and the display panel DP. For example, a separate adhesive member might not be disposed between the sensor layer IS and the display panel DP. In addition, in an embodiment of the present inventive concept, the sensor layer IS may be bonded to the display panel DP through an adhesive member. The adhesive member may include a general adhesive or a gluing agent.

A window adhesive layer AP-W may be disposed between the window WM and the display module DM. The window adhesive layer AP-W may be an optically clear adhesive film (OCA) or an optically clear adhesive resin layer (OCR).

The display device ED of an embodiment of the present inventive concept may further include a lower film LF disposed below the display module DM. The lower film LF may be disposed below the display module DM to protect a lower portion of the display panel DP. The display device ED according to an embodiment of the present inventive concept may include a lower adhesive layer AP-L that bonds the display module DM with the lower film LF.

The lower film LF may be a polymer film. For example, the lower film LF may include a polyethylene terephthalate (PET) film or a polyimide (PI) film. The lower film LF may prevent scratches from being caused on a rear surface of the display panel DP in a process of manufacturing the display panel DP. In addition, the lower film LF protects the display panel DP from external pressure, and may thus, prevent the display panel DP from being deformed. The lower film LF may have a structure in which one film layer or a plurality of film layers are stacked.

The lower adhesive layer AP-L may be disposed between the display panel DP and the lower film LF. The lower adhesive layer AP-L may be an optically clear adhesive film (OCA) or an optically clear adhesive resin layer (OCR). However, the embodiment of the present inventive concept is not limited thereto, and the lower adhesive layer AP-L may include an acryl-based adhesive or a silicone-based adhesive. In addition, in an embodiment of the present inventive concept, the lower adhesive layer AP-L may be omitted.

The display device ED according to an embodiment of the present inventive concept may include a support module SM disposed below the display module DM. The support module SM may include a support plate MP and a lower support member BSM.

The support plate MP may be disposed below the display module DM. The support plate MP may be disposed below the lower film LF. In an embodiment of the present inventive concept, the support plate MP may include a metal material or a polymer material. For example, the support plate MP may include stainless steel, aluminum, or an alloy thereof. In addition, the support plate MP may include carbon fiber reinforced plastic (CFRP) or the like. However, the present inventive concept is not limited thereto, and the support plate MP may include a non-metal material, plastic, glass fiber reinforced plastic, or glass.

A plurality of openings OP may be formed in the support plate MP. The support plate MP may include an opening pattern OP-PT including the plurality of openings OP. The opening pattern OP-PT may correspond to the folding region FA1.

The lower support member BSM may include a support member SPM and a filling portion SAP. The support member SPM may overlap the display module DM. For example, the support member SPM may be a portion overlapping most regions of the display module DM. For example, the support member SPM may overlap inner portions of the display module DM. The filling portion SAP may be a portion disposed outside the support member SPM and overlapping an outer portion of the display module DM.

The lower support member BSM may include at least one of a support layer SP, a cushion layer CP, a shielding layer EMP, or an interlayer bonding layer ILP. In addition, the configuration of the lower support member BSM is not limited to what is shown in FIG. 4, and the configuration of the lower support member BSM may vary depending on the size, shape, or operation characteristics of the display device ED. For example, some of the support layer SP, the cushion layer CP, the shielding layer EMP, and the interlayer bonding layer ILP may be omitted, or the stacking order thereof may be modified in an order different from what is shown in FIG. 4, or additional components other than the described components may be further included. For example, the lower support member BSM may further include a digitizer or the like.

The support layer SP may include, for example, a metal material or a polymer material. The support layer SP may be disposed below the support plate MP. For example, the support layer SP may be a thin film metal substrate.

The support layer SP may include a first sub support layer SSP1 and a second sub support layer SSP2 that are spaced apart from each other in the second direction DR2. The first sub support layer SSP1 and the second sub support layer SSP2 may be spaced apart from each other with respect to a portion corresponding to the folding axis FX1. The support layers SP are spaced apart from each other in the folding region FA1 to serve as the first sub support layer SSP1 and the second sub support layer SSP2, thereby improving folding or bending characteristics of the display device ED.

The cushion layer CP may be disposed below the support layer SP. The cushion layer CP may prevent the support plate MP from being pressed and plastically deformed due to external impact and force. Accordingly, the cushion layer CP may increase impact resistance of the display device ED. The cushion layer CP may include sponge, foam, or elastomer such as a urethane resin. In addition, the cushion layer CP may include at least one of, for example, an acrylic polymer, a urethane-based polymer, a silicone-based polymer, or an imide-based polymer. However, the present inventive concept is not limited thereto.

In addition, the cushion layer CP may include a first sub cushion layer CP1 and a second sub cushion layer CP2 that are spaced apart from each other in the second direction DR2. The first sub cushion layer CP1 and the second sub cushion layer CP2 may be spaced apart from each other at a portion corresponding to the first folding axis FX1. The cushion layers CP are spaced apart from each other in the folding region FA1 to serve as the first sub cushion layer CP1 and the second sub cushion layer CP2, thereby improving folding or bending characteristics of the display device ED.

The shielding layer EMP may be disposed below the cushion layer CP. The shielding layer EMP may be an electromagnetic wave shielding layer or a heat dissipation layer. In addition, the shielding layer EMP may serve as a bonding layer. The interlayer bonding layer ILP may bond the support plate MP with the lower support member BSM. The interlayer bonding layer ILP may be provided in the form of a bonding resin layer or an adhesive tape. In FIG. 4, the interlayer bonding layer ILP is shown to be divided into two portions spaced apart from each other at a portion corresponding to the folding region FA1, but the present inventive concept is not limited thereto, and the interlayer bonding layer ILP may be provided as a single layer that is not spaced apart in the folding region FA1.

The filling portion SAP may be disposed outside the support layer SP and the cushion layer CP. The filling portion SAP may be disposed between the support plate MP and the housing HAU. The filling portion SAP may fill a space between the support plate MP and the housing HAU, and fix the support plate MP.

In addition, the display device ED according to an embodiment of the present inventive concept may further include a module adhesive layer AP-DM disposed between the lower film LF and the support module SM. The module adhesive layer AP-DM may be an optically clear adhesive film (OCA) or an optically clear adhesive resin layer (OCR). In addition, an additional adhesive layer may be disposed between respective members included in the support module SM.

Figure 8:
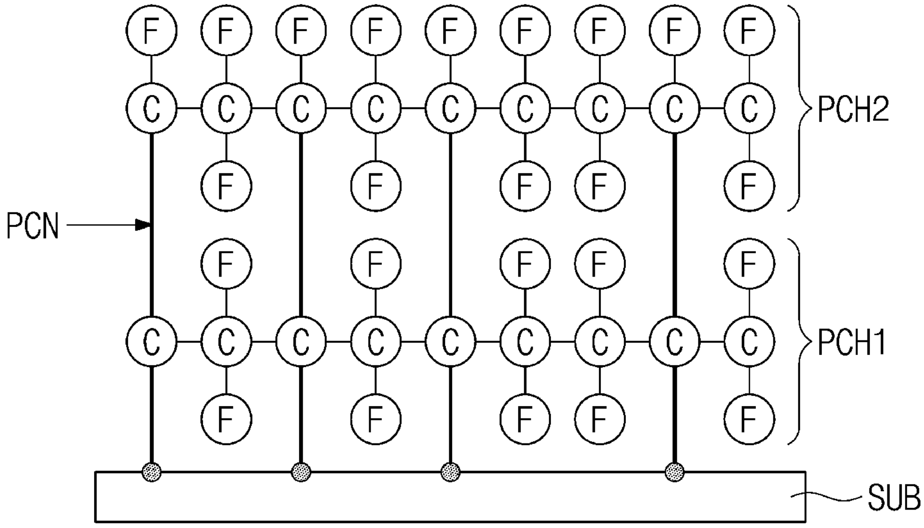
FIG. 8 is a schematic view showing a portion of a window according to an embodiment of the present inventive concept.

FIG. 5 is a cross-sectional view of a window WM according to an embodiment of the present inventive concept. FIG. 6 is a cross-sectional view of a window WM-1 according to an embodiment of the present inventive concept. FIG. 7 is a cross-sectional view of a window WM-2 according to an embodiment of the present inventive concept. FIG. 8 is a schematic view showing a portion of a window WM according to an embodiment of the present inventive concept.

The windows WM, WM-1, and WM-2 shown in FIGS. 5 to 7 may represent the windows WM of an embodiment shown in each of FIGS. 3 and 4, as an example.

Referring to FIG. 5, the window WM of an embodiment may include a base layer BF and a protective layer PL disposed on the base layer BF.

The base layer BF according to an embodiment of the present inventive concept may be formed of a polymer material. The base layer BF may be a flexible polymer film. In the window WM of an embodiment of the present inventive concept, the base layer BF may be a polymer film layer. The base layer BF may include at least one of, for example, polyimide (PI), polyethylene terephthalate (PET), polyamide (PA), polycarbonate (PC), and/or triacetyl cellulose (TAC). However, the present inventive concept is not limited thereto, and the base layer BF may be used without limitation as long as the base layer BF is an optically transparent and flexible material. For example, the window WM according to an embodiment of the present inventive concept may include glass or chemically strengthened glass as the base layer BF.

The base layer BF may have a thickness of about 20 μm to about 100 μm. When the thickness of the base layer BF is within the above range, the base layer BF may sufficiently serve as a support layer provided with the protection layer PL, and a thickness of the display device ED (FIG. 3) may be reduced, in particular, as shown in FIGS. 1A to 2B, foldable displays ED and ED-a may have excellent folding properties.

FIGS. 5 to 7 show that the base layer BF has a cross section having a rectangular shape, but the present inventive concept is not limited thereto, and the base layer BF of an embodiment of the present inventive concept may have a cross section having a round shape in which an edge portion of an upper surface of the base layer BF includes a curved surface.

The above descriptions of the base layer BF may also apply to a base layer BF of the window WM of FIG. 5 and a base layer BF of windows WM-1 and WM-2 of FIGS. 6 and 7.

The protection layer PL may be disposed on the base layer BF. The protection layer PL may include a lower surface P-LF and an upper surface P-UF. The lower surface P-LF may be adjacent to and may face the base layer BF, and the upper surface P-UF may be opposite to the lower surface P-LF. The upper surface P-UF of the protection layer PL may define an outermost surface of the window WM. The upper surface P-UF of the protection layer PL may correspond to an upper surface WM-UF (FIG. 4) of the window WM.

As shown in FIG. 5, in the window WM of an embodiment of the present inventive concept, the protection layer PL may be directly disposed on the base layer BF, and the lower surface P-LF of the protection layer PL may contact the base layer BF.

In an embodiment of the present inventive concept, the protection layer PL may include a low refractive material. For example, the protection layer PL may have a refractive index of about 1.35 or less at a wavelength of about 550 nm. Accordingly, the window WM may have low reflection properties.

In the window WM according to an embodiment of the present inventive concept, the protection layer PL includes a fluorine-based crosslinked polymer. As used herein, the fluorine-based crosslinked polymer may indicate a fluorine-based polymer in which one polymer chain is bonded to another polymer chain with respect to several polymer chains. For example, the fluorine-based crosslinked polymer may include a first polymer chain PCH1, a second polymer chain PCH2 adjacent to the first polymer chain PCH1, and a crosslinking portion PCN for bonding carbon atoms of the first polymer chain PCH1 and carbon atoms of the second polymer chain PCH2 to one another. For example, the crosslinking portion PCN may bond carbon atoms of the first polymer chain PCH1 to carbon atoms of the second polymer chain PCH2.

For example, FIG. 8 shows a fluorine-based crosslinked polymer in which polytetrafluoroethylene (PTFE) is bonded to neighboring polymer chains PCH1 and PCH2. For example, a state in which some carbon atoms of the PTFE polymer chain PCH1 are bonded (crosslinked) with some carbon atoms of other neighboring or adjacent PTFE polymer chain PCH2 through carbon-carbon covalent bonding (crosslinking) is shown.

The fluorine-based polymer constituting the fluorine-based crosslinked polymer may include all polymers including fluorine atoms. For example, the fluorine-based polymer may include at least one of polytetrafluoroethylene (PTFE), perfluoroalkoxy alkane (PFA), and/or fluorinated ethylene propylene (FEP). The bond of carbon atoms and fluorine atoms included in these fluorine-based polymers is strong and stable, thereby providing excellent heat resistance, chemical resistance, and abrasion resistance, and accordingly, may be less likely to cause cracks upon several folding operations when applied to the protection layer PL of the window WM, even in a display device having a low curvature structure.

In an embodiment of the present inventive concept, the protection layer PL may include perfluoropolyether (PFPE) and polytetrafluoroethylene (PTFE) as a fluorine-based polymer constituting a fluorine-based crosslinked polymer.

PFPE may include a unit represented by Formula 1 below, and PTFE may include a unit represented by Formula 2 below.

[Formula 1]

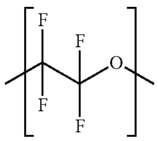

[Formula 2]

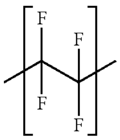

The fluorine-based polymer may include a simple mixture of PFPE and PTFE, or may include a PFPE-PTFE block copolymer. PFPE has excellent anti-fingerprint properties and slip properties, and provides increased vibration and abrasion resistance when PTFE is included together. When the PFPE-PTFE block copolymer is included, PFPE and PTFE may be in a weight ratio of about 1:9 to about 3:7. In the case of a polymer within the above range, vibration and abrasion resistance may be further increased.

As the protection layer PL of an embodiment of the present inventive concept includes a fluorine-based crosslinked polymer crosslinked between the polymer chains PCH1 and PCH2, cracks may be prevented, and accordingly, excellent folding properties may be achieved. For example, cracks may be prevented even in a low curvature structure. In addition, the strong intermolecular covalent bonds between different polymer chains PCH1 and PCH2 provide increased film quality, and thus, heat resistance, chemical resistance, and abrasion resistance may be further increased, and accordingly, crack propagation may be prevented, and also the low reflection properties may remain.

In addition, as shown in FIG. 8, some carbon atoms included in the polymer chain PCH1 of the fluorine-based crosslinked polymer may be covalently bonded to and strongly attached to another adjacent substrate SUB. FIG. 8 collectively shows the substrate SUB, but the substrate SUB may correspond to the base layer BF in FIG. 5 and may correspond to the hard coating layer HC in FIG. 6, and may correspond to the adhesive layer AD in FIG. 7.

In an embodiment of the present inventive concept, the protection layer PL may have a thickness of about 70 nm to about 130 nm. When the window WM does not include a separate low refractive layer LR (FIG. 7), the protection layer PL may exhibit a low reflection property of about 2.0% or less (a wavelength of about 550 nm) in the above thickness range and uniform reflectance in the entire visible light region.

In an embodiment of the present inventive concept, the window WM may have a reflectance of about 2.0% or less on a surface thereof at a wavelength of about 550 nm. In the window WM according to an embodiment of the present inventive concept, the protection layer PL may be disposed on an uppermost layer, and the reflectance on an upper surface of the protection layer PL may be about 2.0% or less at a wavelength of about 550 nm. At a wavelength of about 550 nm, the reflectance on the upper surface of the protection layer PL may be about 0.5% to about 1.5%. In addition, as used herein, the "reflectance" of the window WM may be defined as a ratio of light reflected to the outside on the upper surface with respect to light incident in a direction of the window WM from the outside.

In the window WM of an embodiment of the present inventive concept, an initial water contact angle of an exposed surface of the protection layer PL may be about 1000 or greater. For example, in the window WM of an embodiment of the present inventive concept, the initial water contact angle of an upper surface P-UF of the protection layer PL may be about 100° or greater. When the initial water contact angle of the protection layer PL is within the above range, the protection layer PL has greater antifouling properties, and thus the window WM of an embodiment of the present inventive concept may exhibit further increased anti-fingerprint properties and stain resistance properties.

As shown in FIG. 6, the window WM-1 of an embodiment of the present inventive concept may further include a hard coating layer HC disposed between the base layer BF and the protection layer PL. In the window WM-1 of an embodiment of the present inventive concept, the hard coating layer HC may serve to protect the base layer BF.

A high refractive layer may be directly disposed on the base layer BF. However, the present inventive concept is not limited thereto, and the hard coating layer HC may be disposed below the base layer BF, and may be further disposed below the base layer BF in addition to a hard coating layer HC disposed above the base layer BF.

In an embodiment of the present inventive concept, the protection layer PL may be directly disposed on the hard coating layer HC, and the lower surface P-LF of the protection layer PL may contact the hard coating layer HC.

The hard coating layer HC may include a resin for hard coating including at least one of, for example, an organic-based composition, an inorganic-based composition, and/or an organic-inorganic composite composition. For example, a hard coating agent forming the hard coating layer HC may be a hard coating composition including at least one of, for example, an acrylate-based compound, a siloxane compound, or a silsesquioxane compound.

In addition, the hard coating agent may further include inorganic particles. In the hard coating agent, the inorganic particles may be used to increase the hardness of the hard coating layer HC. The inorganic particle may include at least one of, for example, $SiO_2$, $TiO_2$, $Al_2O_3$, $ZrO_2$, ZnO, AlN, and $Si_3N_4$. The inorganic particles may be surface-treated with an organic material such as silane to increase dispersibility in the hard coating composition.

The window WM-1 of an embodiment may further include an adhesive layer disposed between the hard coating layer HC and the base layer BF. The adhesive layer may bond the coating layer HC and the base layer BF. The adhesive layer may include a silicone-based resin, an acrylic-based resin, or a urethane-based resin.

As shown in FIG. 7, the window WM-2 of an embodiment of the present inventive concept may further include a low refractive layer LR disposed between the base layer BF and the protection layer PL. For example, the low refractive layer LR may be directly disposed on the base layer BF.

The low refractive layer LR may have a lower refractive index than the base layer BF. At the wavelength of about 550 nm, the low refractive layer LR may have a refractive index of about 1.3 to about 1.5, for example, about 1.38 to about 1.40.

The low refractive layer LR may include a material having a low refractive index and high adhesion to the base layer BF. The low refractive layer LR may include at least one of, for example, silica, fused silica, fluorine-doped fused silica, magnesium fluoride (($MgF_{2\_}$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). For example, the low refractive layer LR may include magnesium fluoride ($MgF_2$) or a solid state solution in which magnesium fluoride ($MgF_2$), yttrium oxyfluoride (YOF), and magnesium oxide (MgO) are mixed.

The low refractive layer LR may have a thickness of, for example, about 50 nm to about 150 nm. Within the above range, the window WM-2 may have sufficiently reduced reflectance and maintain mechanical strength to have durability.

The window WM-2 of an embodiment of the present inventive concept may further include an adhesive layer AD disposed between the low refractive layer LR and the protection layer PL. In the window WM-2 of an embodiment of the present inventive concept, the protection layer PL may be directly disposed on the adhesive layer AD, and the lower surface P-LF of the protection layer PL may contact the adhesive layer AD.

The adhesive layer AD may be a layer for increasing adhesion between the low refractive layer LR and the protection layer PL. The adhesive layer AD has high adhesion to each of the low refractive layer LR and the protection layer PL, and may thus serve as an adhesion promoter that increases mutual adhesion between the adhesive layer AD and the protection layer PL. The adhesive layer AD may be directly disposed on the low refractive layer LR.

The adhesive layer AD may have low refractive properties, increased mechanical strength, and include a material for increasing adhesion. The adhesive layer AD may include a material having a lower refractive index than a material included in the base layer BF. The adhesive layer AD may include at least one of, for example, silica, fused silica, fluorine-doped fused silica, magnesium fluoride (($MgF_{2\_}$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). For example, the adhesive layer AD may include at least one of silica ($SiO_2$), magnesium oxide (MgO), and/or aluminum oxide ($Al_2O_3$).

In addition, the adhesive layer AD may include a solid state solution in which aluminum oxide and silicon dioxide are mixed. For example, the adhesive layer AD may have a solid state solution structure including solid state solution.

The adhesive layer AD may have a thickness of, for example, about 5 nm to about 30 nm. When the thickness of the adhesive layer AD is within the above range, the adhesion between the low refractive layer LR and the protection layer PL is increased and also the reflectance of the window WM-2 might not increase.

The adhesive layer AD may have a refractive index of about 1.3 to about 1.6 at a wavelength of 550 nm. In the window WM-2 of an embodiment, the adhesive layer AD may have a refractive index of about 1.45 to about 1.50 at a wavelength of 550 nm.

As shown in FIG. 7, when the window WM-2 includes a separate low refractive layer LR, the protection layer PL may have a thickness of, for example, about 2 nm to about 40 nm. Increased vibration and abrasion resistance may be achieved in the above thickness range.

A method of manufacturing a window WM of an embodiment of the present inventive concept includes preparing a base layer BF, and forming a protection layer PL by depositing a fluorine-based polymer on the base layer BF in a vacuum condition.

In the preparing of the base layer BF, the base layer BF may be formed of a polymer material. The base layer may be a flexible polymer film. The base layer may be formed from at least one of, for example, polyimide (PI), polyethylene terephthalate (PET), polyamide (PA), polycarbonate (PC), and/or triacetyl cellulose (TAC). However, the present inventive concept is not limited thereto, and the base layer BF may be used without limitation as long as the base layer BF is an optically transparent and flexible material.

In the forming of the protection layer PL, the protection layer PL may be prepared through a deposition polymerization method in a vacuum condition. In the protection layer PL, the fluorine-based polymer may be irradiated with electron beams for evaporation to deposit a thin film.

The forming of the protection layer PL includes irradiating the fluorine-based polymer with an electron beam to remove some fluorine atoms bonded to a polymer chain, and subjecting carbon atoms at the position from which the fluorine atoms are removed to crosslinking between polymer chains with adjacent polymer chains through carbon-carbon bonds to form a fluorine-based crosslinked polymer.

Some of the fluorine atoms bonded to the polymer chain of the fluorine-based polymer may be removed through the irradiation of electron beams, and then the carbon atoms at the position from which the fluorine atoms are removed may be bonded to carbon atom of another polymer chain at an adjacent position. FIG. 8 schematically shows a fluorine-based crosslinked polymer in a bonded state between polymer chains PCH1 and PCH2 of PTFE.

In addition, in the forming of the protection layer, the fluorine-based polymer is irradiated with the electron beams, and the carbon atoms at the position from which the fluorine atoms are removed may be covalently bonded to another adjacent substrate SUB and strongly attached. As described above, FIG. 8 collectively shows the substrate SUB, but the substrate SUB may correspond to the base layer BF in FIG. 5 and may correspond to the hard coating layer HC in FIG. 6, and may correspond to the adhesive layer AD in FIG. 7.

Energy of the electron beams applied to the fluorine-based polymer may be about 200 KeV to about 400 KeV, and for example, about 300 KeV. In the above energy range, some fluorine atoms included in the fluorine-based polymer may be removed, and carbon-carbon bonds may be formed between the polymer chains PCH1 and PCH2.

As described above, the fluorine-based polymer used to form the protection layer PL may include all polymers including fluorine atoms. For example, the fluorine-based polymer may include at least one of PTFE, PFA, and/or FEP. The bond of carbon atoms and fluorine atoms included in these fluorine-based polymers is strong and stable, thereby providing excellent heat resistance, chemical resistance, and abrasion resistance, and accordingly, may be less likely to cause cracks even upon several folding operations that are applied to the protection layer.

When the protection layer PL is formed by vacuum depositing the fluorine-based polymer through the irradiation of electron beams, a strong bond is formed between polymer chains of the fluorine-based polymer and may be strongly attached to the adjacent substrate SUB. Accordingly, excellent film quality is provided, and thus heat resistance, chemical resistance, and abrasion resistance may be further increased to prevent crack propagation and achieve low reflection properties.

Although the protection layer PL is described to be directly formed on the base layer BF, the present inventive concept is not limited thereto. For example, after the hard coating layer HC described above in FIG. 6 is formed on the base layer BF, the protection layer PL may be formed on the hard coating layer HC, or after the low refractive layer LR and the adhesive layer AD described above in FIG. 7 are formed, the protection layer PL may be formed on the adhesive layer AD.

Table 1 below shows the results of evaluating crack strain (%) and reflectance (%) according to Examples and Comparative Examples. The crack strain is a ratio of the length at the point when cracks are generated by stretching a specimen to an initial length, and the reflectance is a measure of the reflectance on an upper surface of a specimen at a wavelength of 550 nm.

In Examples A and B and Comparative Examples A to C, PET was used as a base layer and an acryl-based resin was used as a hard coating layer. In Examples A and B, PTFE was vacuum deposited to have a thickness of 100 nm through electron beam irradiation (Vb: −300 V, Ie: 30 mA) to form a protection layer on the hard coating layer. The difference is that in Example A, an edge was cut with a knife cutter, and in Example B, an edge was cut with a $CO_2$ laser.

In Comparative Example A, $ZrO_x$(110 nm)/SiO(80~90 nm) was applied onto the hard coating layer to form a protection layer. In Comparative Example B, $Nb_2O_5$(11 nm)/$SiO_2$(25 nm)/$Nb_2O_5$(105 nm)/$SiO_2$(68 nm) was applied onto the hard coating layer to form a protection layer. In Comparative Example C, PTFE was simply heated (350° C.) to have a thickness of 100 nm on the hard coating layer and vacuum deposited to form a protection layer.

TABLE 1

| | Example A | Example B | Comparative Example A | Comparative Example B | Comparative Example C |
|---|---|---|---|---|---|
| Crack strain (%) | 5.5 | 11 | 4.5 | 2 | 5.5 |
| Reflectance (%) | 1.34 | 1.2 | 1.33 | 0.25 | 4.33 |

Referring to Table 1, Examples A and B and Comparative Example C used a fluorine-based polymer as a protection layer, and accordingly, it is determined that Examples A and B and Comparative Example C had superior crack strain (%) to Comparative Examples A and B. For example, in the case of the protection layer including a fluorine-based crosslinked polymer as in Examples A and B, the extent of strain until cracks are caused is great. Therefore, with respect to the window and the display device including the protection layer according to an embodiment of the present inventive concept, cracks that may be caused upon a folding operation or in a low curvature structure may be prevented.

In addition, it is determined that Examples A and B had superior reflectance than Comparative Example C which was simply heated and deposited as the fluorine-based polymer was deposited in the form of a fluorine-based crosslinked polymer crosslinked between polymer chains through electron beam deposition.

In addition, Example B is a specimen cut with a laser, and very few cracks occur on an edge of the specimen compared to Example 1 in which the specimen is cut with a knife cutter. That is, Example A has cracks on the edge of the specimen, and Example B has relatively less cracks on the edge of the specimen. Accordingly, it is determined that the crack strain is further increased in Example B in which the factor by cutting is removed.

Figure 9:
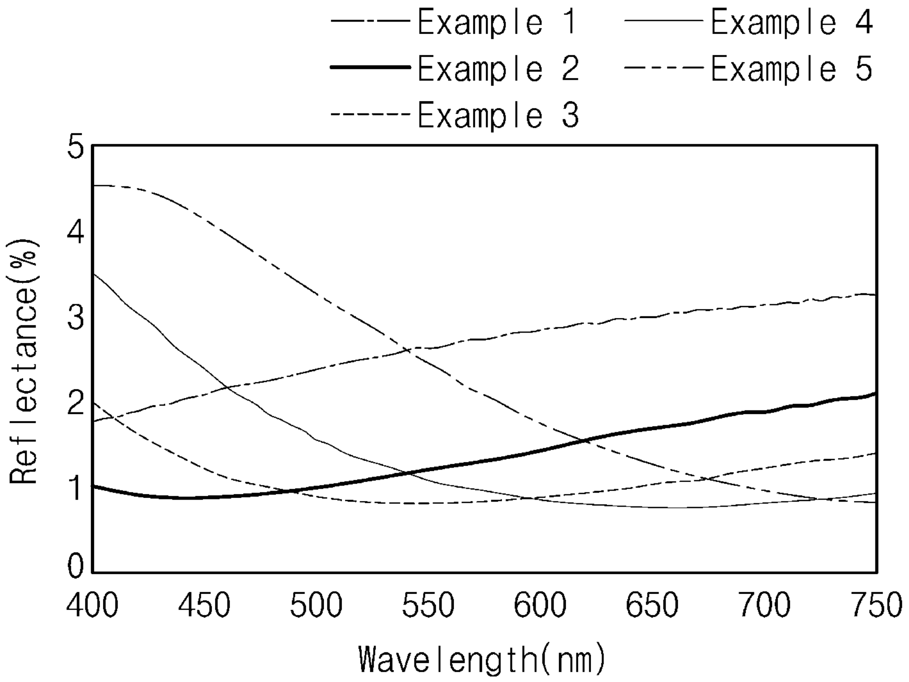
FIG. 9 is a graph showing the reflectance of a window according to an embodiment of the present inventive concept.

FIG. 9 shows the result of evaluating the reflectance of the upper surface of the protection layer according to the thickness of the protection layer by simulation (Vector Diagram Simulation). The protection layers of Examples 1 to 5 were vacuum deposited while irradiating PTFE with electron beams (Vb: −300 V, Ie: 30 mA), and the thickness of the protection layer and the reflectance of the protection layer at a wavelength of 550 nm are shown in Table 2 below.

TABLE 2

| | Example 1 | Example 2 | Example 3 | Example 4 | Example 5 |
|---|---|---|---|---|---|
| Thickness (nm) | 50 | 80 | 100 | 120 | 150 |
| Reflectance (%, 550 nm) | 2.65 | 1.23 | 0.82 | 1.09 | 2.47 |

Referring to Table 2 and FIG. 9 together, it is determined that all of the protection layers of Examples 1 to 5 exhibit excellent low reflection properties. For example, it is determined that Examples 2 to 4 having a thickness range of about 70 nm to about 130 nm exhibited a reflectance of 2.0% or less, indicating further improved low reflection properties.

As described above, a window according to an embodiment of the present inventive concept includes a fluorine-based crosslinked polymer having improved intermolecular bonding strength, and may thus exhibit excellent folding properties and have low reflection properties.

In addition, a method of manufacturing a window according to an embodiment of the present inventive concept may provide a window having low reflection properties and excellent folding properties through the vacuum deposition of a fluorine-based polymer using an electron beam when forming a protection layer.

In addition, a display device according to an embodiment of the present inventive concept includes a window having excellent low reflection properties and excellent folding properties, and may thus have improved viewability and folding properties.

While the present inventive concept has been described with reference to embodiments thereof, it will be understood by those of ordinary skill in the art that various changes in form and details may be made thereto without departing from the spirit and scope of the present inventive concept.

What is claimed is:

1. A window comprising:

a base layer; and a protection layer disposed on the base layer and including a fluorine-based crosslinked polymer, wherein the fluorine-based crosslinked polymer includes a first polymer chain, a second polymer chain, and a crosslinking portion that directly covalently bonds carbon atoms of the first polymer chain to carbon atoms of the second polymer chain through carbon-carbon covalent bonds, wherein the fluorine-based crosslinked polymer comprises a perfluoropolyether-polytetrafluoroethylene block copolymer (PFPE-PTFE block copolymer), and PFTE and PTFE included in the PFPE-PTFE block copolymer are in a weight ratio of about 1:9 to about 3:7 .

2. The window of claim 1, wherein the protection layer has a thickness of about 70 nm to about 130 nm.

3. The window of claim 1, wherein the protection layer has a refractive index of about 1.35 or less at a wavelength of about 550 nm.

4. The window of claim 1, wherein the protection layer has a reflectance of about 2.0% or less on an upper surface thereof at a wavelength of about 550 nm.

5. The window of claim 1, wherein an upper surface of the protection layer has an initial water contact angle of about 100° or greater.

6. The window of claim 1, wherein some carbon atoms included in the first polymer chain of the fluorine-based crosslinked polymer that is adjacent to the base layer are covalently bonded to the base layer.

7. The window of claim 1, further comprising a hard coating layer disposed between the base layer and the protection layer, wherein some carbon atoms included in the first polymer chain of the fluorine-based crosslinked polymer that is adjacent to the hard coating layer are covalently bonded to the hard coating layer.

8. The window of claim 1, wherein the protection layer has a thickness of about 2 nm to about 40 nm.

9. The window of claim 1, wherein the protection layer has a refractive index of about 1.35 or less at a wavelength of about 550 nm.

10. The window of claim 1, further comprising a refractive layer disposed between the base layer and the protection layer, and an adhesive layer disposed between the refractive layer and the protection layer, wherein some carbon atoms included in the first polymer chain of the fluorine-based crosslinked polymer that is adjacent to the adhesive layer are covalently bonded to the adhesive layer.

11. An electronic device comprising:

a display module including a first non-folding region, a folding region, and a second non- folding region, which are arranged along a first direction; and a window disposed on the display module, wherein the window includes:

a base layer; and a protection layer disposed on the base layer and including a fluorine-based crosslinked polymer, wherein the fluorine-based crosslinked polymer includes a first polymer chain, a second polymer chain, and a crosslinking portion that directly covalently bonds carbon atoms of the first polymer chain to carbon atoms of the second polymer chain through carbon-carbon covalent bonds, wherein the fluorine-based crosslinked polymer comprises a perfluoropolyether-polytetrafluoroethylene block copolymer (PFPE-PTFE block copolymer), and PFTE and PTFE included in the PFPE-PTFE block copolymer are in a weight ratio of about 1:9 to about 3:7.

* * * * *